US012009370B2

(12) United States Patent
Kim et al.

(10) Patent No.: US 12,009,370 B2
(45) Date of Patent: Jun. 11, 2024

(54) DISPLAY DEVICE

(71) Applicant: Samsung Display Co., LTD., Yongin-si (KR)

(72) Inventors: Jeong Hwan Kim, Hwaseong-si (KR); Yong Duck Son, Seongnam-si (KR); Min-Sik Jung, Seoul (KR); Jun Hwi Park, Asan-si (KR); Da Bin Lee, Seoul (KR); Won Ho Jang, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 374 days.

(21) Appl. No.: 17/461,055

(22) Filed: Aug. 30, 2021

(65) Prior Publication Data
US 2022/0189995 A1    Jun. 16, 2022

(30) Foreign Application Priority Data

Dec. 11, 2020 (KR) ........................ 10-2020-0173390

(51) Int. Cl.
*H01L 27/14*   (2006.01)
*H01L 27/12*   (2006.01)
*H01L 27/15*   (2006.01)
*H10K 59/121*  (2023.01)

(52) U.S. Cl.
CPC ........ *H01L 27/124* (2013.01); *H01L 27/1255* (2013.01); *H01L 27/156* (2013.01); *H10K 59/1213* (2023.02)

(58) Field of Classification Search
CPC . H01L 27/124; H01L 27/1255; H01L 27/156; H01L 29/78648; H01L 27/1218; H01L 27/1248; H10K 59/1213; H10K 59/131; H10K 59/12; H10K 59/1216; G09G 3/3225
USPC ....................................................... 257/59, 72
See application file for complete search history.

(56) References Cited

U.S. PATENT DOCUMENTS 10,453,944 B2   10/2019 Park et al.
2020/0118508 A1*  4/2020 Park ..................... H01L 27/1251

FOREIGN PATENT DOCUMENTS

| JP | 3371192 | 1/2003 |
| KR | 10-0477143 | 8/2005 |
| KR | 10-2014-0120542 | 10/2014 |
| KR | 10-2017-0080047 | 7/2017 |

* cited by examiner

*Primary Examiner* — Tan N Tran
(74) *Attorney, Agent, or Firm* — KILE PARK REED & HOUTTEMAN PLLC

(57) ABSTRACT

A display device includes a metal layer disposed on a substrate; a transistor disposed on the metal layer; and a light emitting element electrically connected to the transistor, wherein the transistor includes a semiconductor layer at least partially overlapping the metal layer, the semiconductor layer includes a first region, a second region, and a channel region disposed between the first region and the second region, and the metal layer overlaps the second region and the channel region and is spaced apart from the first region in a plan view.

18 Claims, 12 Drawing Sheets

ABSTRACT# DISPLAY DEVICE

CROSS-REFERENCE TO RELATED APPLICATION(S)

This application claims priority to and benefits of Korean Patent Application No. 10-2020-0173390 under 35 U.S.C. § 119, filed on Dec. 11, 2020 in the Korean Intellectual Property Office, the entire contents of which are incorporated herein by reference.

BACKGROUND

1. Technical Field

The disclosure relates to a display device.

2. Description of the Related Art

Recently, as a self-emissive display device, an emissive display device has been attracting attention. An emissive display device has a self-emissive characteristic, eliminating the necessity for a light source, unlike a liquid crystal display (LCD) device, and thus can be fabricated to be thinner and lighter. Further, the emissive display device has high quality characteristics such as low power consumption, high luminance, high response speed, and the like.

In general, the emissive display device may include pixels, and each pixel may include transistors and a light emitting element. The transistors may be electrically connected to scan lines, data lines, and the like, to transmit driving currents to the light emitting elements.

The above information disclosed in this background section is only for enhancement of understanding of the background of the disclosure, and therefore it may contain information that does not form the prior art that may already be known to a person of ordinary skill in the art.

SUMMARY

Embodiments provide a transistor formed in a stable shape and a display device including the same.

An embodiment provides a display device that may include a metal layer disposed on a substrate; a transistor disposed on the metal layer; and a light emitting element electrically connected to the transistor, wherein the transistor may include a semiconductor layer at least partially overlapping the metal layer, the semiconductor layer may include a first region, a second region, and a channel region disposed between the first region and the second region, and the metal layer overlaps the second region and the channel region and is spaced apart from the first region in a plan view.

The display device may further include a driving voltage line that overlaps a portion of the first region of the semiconductor layer.

The driving voltage line and the metal layer may be disposed on a same layer.

The driving voltage line and the metal layer may be spaced apart from each other.

The display device may further include an auxiliary driving voltage line electrically connected to the first region through a first contact hole; and an upper storage electrode electrically connected to the second region through a second contact hole.

The driving voltage line may include an opening overlapping the first contact hole.

The transistor may be a first transistor, and the display device may further include a second transistor and a third transistor that are electrically connected to the first transistor.

The display device may further include a buffer layer disposed between the metal layer and the semiconductor layer.

The transistor may include a gate electrode disposed on the channel region.

The display device may further include a first insulating layer disposed between the gate electrode and the channel region; and a second insulating layer disposed between the gate electrode and the auxiliary driving voltage line.

The second insulating layer may include the first contact hole and the second contact hole.

An embodiment provides a display device that may include a conductive layer disposed on a substrate; a transistor disposed on the conductive layer; and a light emitting element electrically connected to the transistor. The transistor may include a semiconductor layer that overlaps a portion of the conductive layer; and a gate electrode disposed on the semiconductor layer, the semiconductor layer may include a first region, a second region, and a channel region disposed between the first region and the second region, the conductive layer may include a driving voltage line and a metal layer that are spaced apart from each other, the driving voltage line may overlap the first region of the semiconductor layer, and the metal layer may overlap the second region of the semiconductor layer.

The display device may further include an auxiliary driving voltage line electrically connected to the first region through a first contact hole; and an upper storage electrode electrically connected to the second region through a second contact hole.

The driving voltage line may include an opening overlapping the first contact hole.

The display device may further include a buffer layer disposed between the conductive layer and the semiconductor layer.

The transistor may include a gate electrode disposed on the channel region, and the display device may include a first insulating layer disposed between the gate electrode and the channel region; and a second insulating layer disposed between the gate electrode and the auxiliary driving voltage line.

The second insulating layer may include the first contact hole and the second contact hole.

The display device may include a lower storage electrode electrically connected to the gate electrode, and the upper storage electrode and the lower storage electrode may overlap each other.

The transistor may be a first transistor, and the display device may further include a second transistor and a third transistor that are electrically connected to the first transistor.

The display device may further include a data line electrically connected to the second transistor; and an initialization voltage line electrically connected to the third transistor.

The data line, the initialization voltage line, and the metal layer may be disposed on a same layer.

According to embodiments, since the transistor positioned or disposed on the conductive layer is formed in a stable shape, a transistor having desired characteristics and a display device including the same may be provided.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
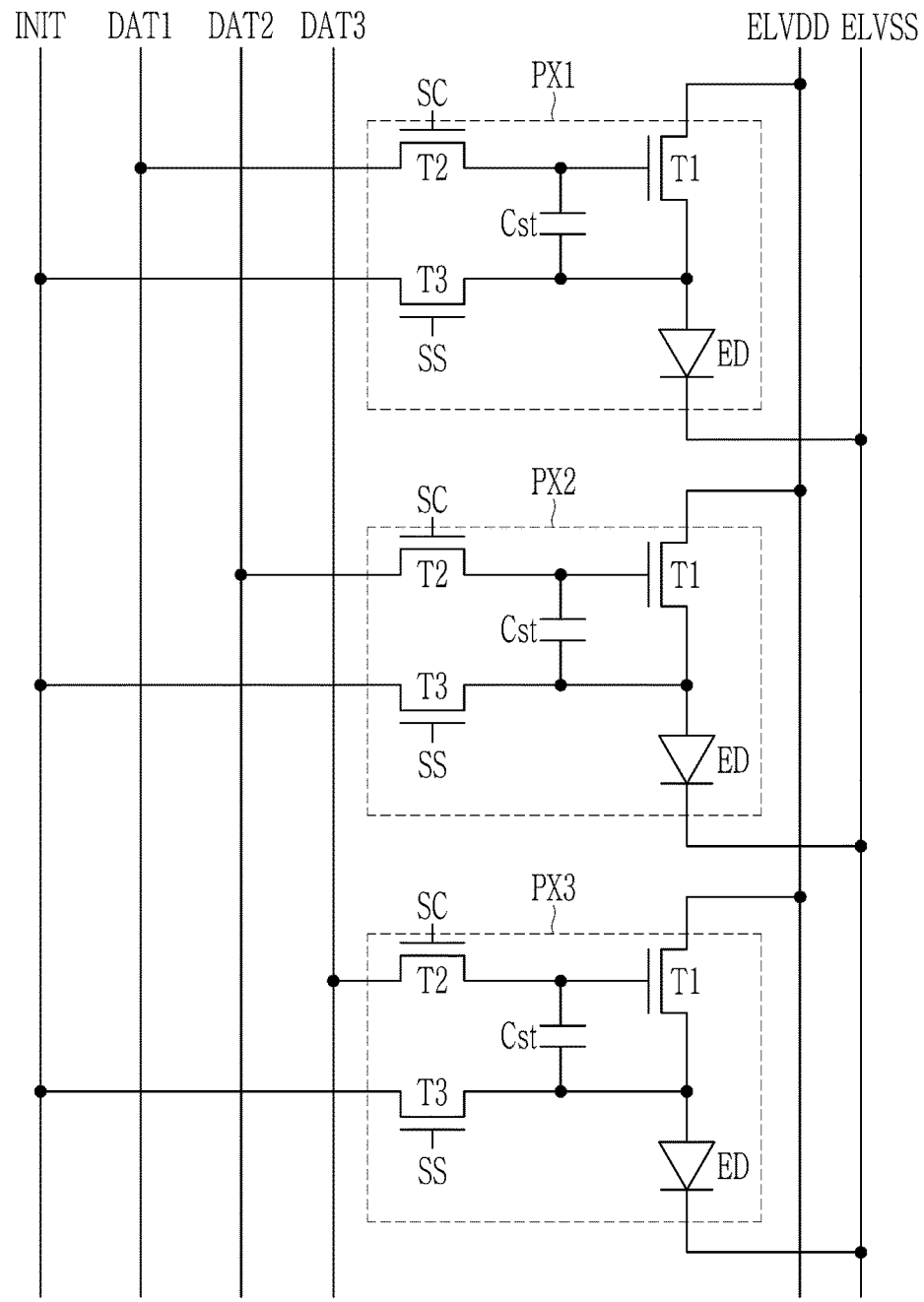
FIG. 1 illustrates a schematic diagram of an equivalent circuit of a pixel according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

To clearly describe the disclosure, parts that may be irrelevant to the description may be omitted, and like numerals refer to like or similar constituent elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., may be exaggerated for clarity. In the drawings, for better understanding and ease of description, the thicknesses of some layers and areas may be exaggerated.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In addition, unless explicitly described to the contrary, the word "comprise" and variations such as "comprises" or "comprising", "includes," and/or "including,", "has," "have," and/or "having," and variations thereof will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a schematic diagram of an equivalent circuit of a pixel according to an embodiment. Hereinafter, a pixel according to an embodiment will be described with reference to FIG. 1.

Referring to FIG. 1, the display device according to an embodiment may include pixels PX1, PX2, and PX3. As illustrated in FIG. 1, each of the pixels PX1, PX2, and PX3 may include transistors T1, T2, and T3, a capacitor Cst, and at least one light emitting diode ED as a light emitting element. In an embodiment, an example in which one pixel PX1, PX2, or PX3 may include one light emitting diode ED will be described.

The transistors T1, T2, and T3 include a driving transistor T1, a switching transistor T2, and an initialization transistor T3. A first electrode region and a second electrode region to be described below, which are for separating two electrode regions positioned or located at opposite sides of the channel region of each transistor T1, T2, and T3, may be a source electrode region or a drain electrode region.

A gate electrode of the driving transistor T1 may be electrically connected to a first end of the capacitor Cst. The first electrode region of the first driving transistor T1 may be electrically connected to a driving voltage line transferring a driving voltage ELVDD. The second electrode region of the driving transistor T1 may be electrically connected to an anode of the light emitting diode ED and a second end of the capacitor Cst. The driving transistor T1 may receive data voltages DAT1, DAT2, and DAT3 from a data line depending on a switching operation of the switching transistor T2, to supply a driving current to the light emitting diode ED depending on a voltage stored in the capacitor Cst.

A gate electrode of the switching transistor T2 may be electrically connected to a first scan line SCL that transfers a first scan signal SC. The first electrode region of the switching transistor T2 may be electrically connected to a data line that transfers data voltages DAT1, DAT2, and DAT3 or a reference voltage. The second electrode region of the switching transistor T2 may be electrically connected to the first end of the capacitor Cst and the gate electrode of the driving transistor T1. The switching transistor T2 may be turned on depending on the first scan signal SC to transfer the reference voltage or the data voltages DAT1, DAT2, and DAT3 to the gate electrode of the driving transistor T1 and the first end of the capacitor Cst.

A gate electrode of the initialization transistor T3 may be electrically connected to a second scan line that transfers a second scan signal SS. A first electrode region of the initialization transistor T3 may be electrically connected to the second end of the capacitor Cst, the second electrode region of the driving transistor T1, and the anode of the light emitting diode ED. The second electrode region of the initialization transistor T3 may be electrically connected to an initialization voltage line transferring an initialization voltage INIT. The initialization transistor T3 may be turned on depending on the second scan signal SS, to initialize a voltage of the anode of the light emitting diode ED by transferring the initialization voltage INIT to the anode of the light emitting diode ED and the second end of the capacitor Cst.

The first end of the capacitor Cst may be electrically connected to the gate electrode of the driving transistor T1. The second end of the capacitor Cst may be electrically connected to the first electrode region of the initialization transistor T3 and the anode of the light emitting diode ED. A cathode of the light emitting diode ED may be electrically connected to a common voltage line for transferring a common voltage ELVSS.

The light emitting diode ED may emit light having luminance depending on a driving current generated by the driving transistor T1.

The following describes an example of an operation of the circuit illustrated in FIG. 1, an example of the operation during one frame. Herein, a case in which the transistors T1, T2, and T3 are N-type transistors will be described as an example, but the disclosure is not limited thereto.

In case that a frame is started, the first scan signal SC of a high level and the second scan signal SS of a high level are supplied during an initialization period to turn on the second transistor T2 and the initialization transistor T3. The reference voltage from the data line is supplied to the gate electrode of the driving transistor T1 and the first end of the capacitor Cst through the turned-on switching transistor T2, and the initialization voltage INIT is supplied to the second electrode region of the driving transistor T1 and the anode of the light emitting diode ED through the turned-on initialization transistor T3. Accordingly, the second electrode region of the driving transistor T1 and the anode of the light emitting diode ED are initialized to the initialization voltage INIT during the initialization period. A difference voltage between the reference voltage and the initialization voltage INIT is stored in the capacitor Cst.

In case that the second scan signal SS is changed to a low level in a state where the first scan signal SC of a high level is maintained during a sensing period, the switching transistor T2 maintains a turn-on state and the initialization transistor T3 may be turned off. The gate electrode of the driving transistor T1 and the first end of the capacitor Cst maintain the reference voltage through the turned-on switching transistor T2, and the second electrode region of the driving transistor T1 and the anode of the light emitting diode ED are disconnected from the initialization voltage INIT through the turned-off initialization transistor T3. Accordingly, the driving transistor T1 is turned off in case that a current flows from the first electrode region to the second electrode region and the voltage of the second electrode region becomes a "reference voltage-Vth". Vth represents a threshold voltage of the driving transistor T1. A voltage difference between the gate electrode of the driving transistor T1 and the second electrode region is stored in the capacitor Cst, and sensing of the threshold voltage Vth of the driving transistor T1 is completed. A characteristic deviation of the driving transistor T1 which may be different for each pixel may be externally compensated by generating a data signal that is compensated by reflecting characteristic information sensed during the sensing period.

In case that the first scan signal SC of the high level is supplied and the second scan signal SS of a low level is supplied during a data input period, the switching transistor T2 may be turned on and the initialization transistor T3 may be turned off. The data voltages DAT1, DAT2, and DAT3 from the data line are supplied to the gate electrode of the driving transistor T1 and the first end of the capacitor Cst through the turned-on switching transistor T2. The second electrode region of the driving transistor T1 and the anode of the light emitting diode ED may maintain a potential during the sensing period substantially as it is by the driving transistor T1 which is turned off.

The driving transistor T1 turned on by the data voltages DAT1, DAT2, and DAT3 transferred to the gate electrode during an emission period may generate a driving current depending on the data voltages DAT1, DAT2, and DAT3, and the light emitting diode ED may emit light by the driving current.

Figure 2A:
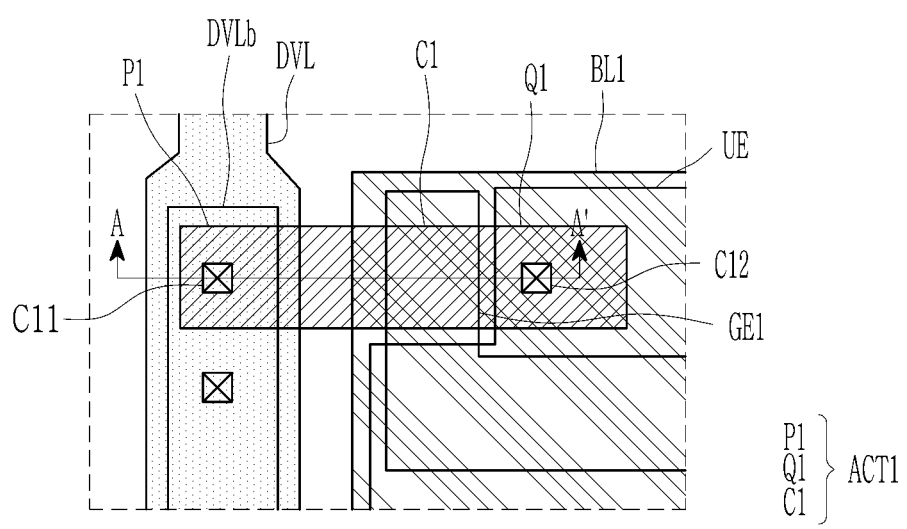
FIG. 2A illustrates a schematic top plan view of a transistor.

Hereinafter, one transistor included in one pixel described above will be described with reference to FIG. 2A and FIG. 2B. FIG. 2A illustrates a schematic top plan view of a transistor, and FIG. 2B illustrates a schematic cross-sectional view taken along a line A-A' of FIG. 2A.

Figure 2B:
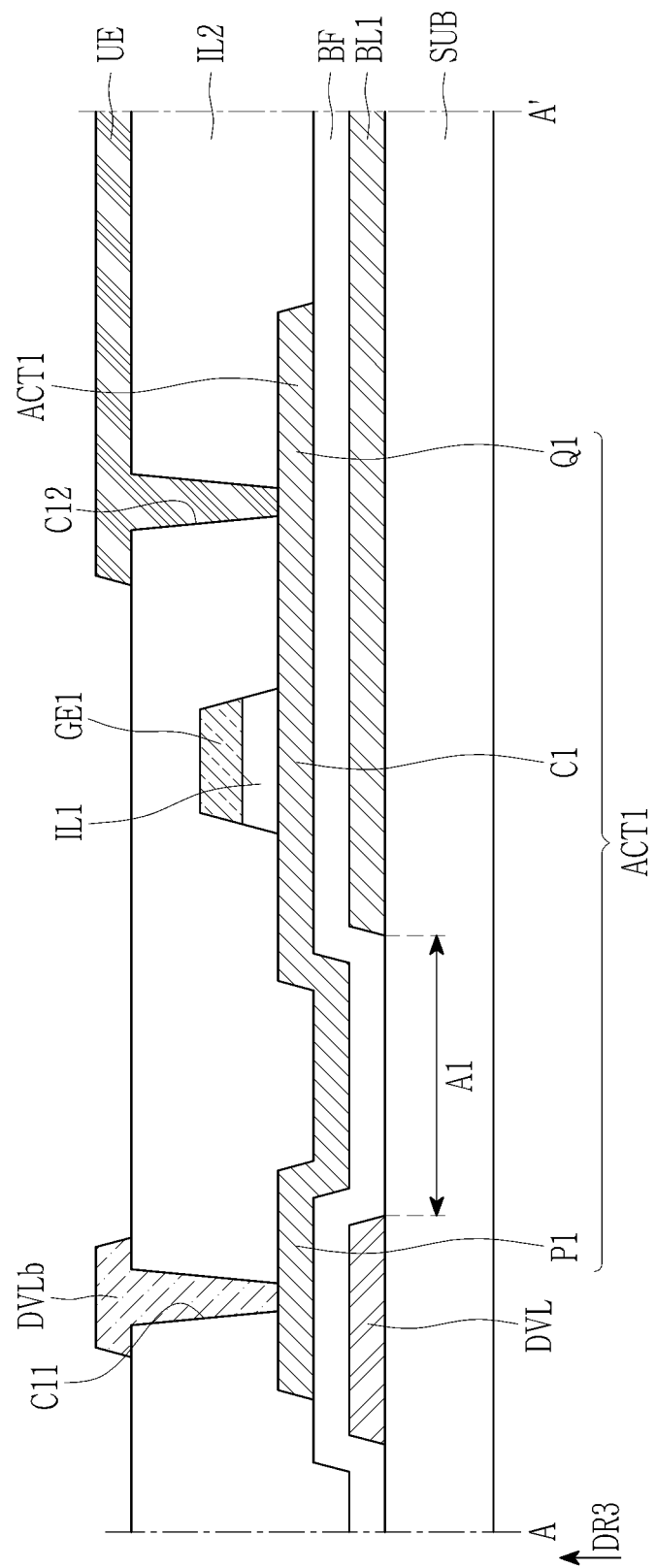
FIG. 2B illustrates a schematic cross-sectional view taken along a line A-A' of FIG. 2A.

Referring to FIG. 2A and FIG. 2B, according to an embodiment, a first conductive layer disposed on a substrate SUB is included. The first conductive layer may include a first metal layer, or a metal layer, BL1 and a driving voltage line DVL transferring the driving voltage ELVDD. The first metal layer BL1 and the driving voltage line DVL may have a shape of being spaced apart from each other with a predetermined interval A1.

The first conductive layer, or conductive layer, BL1 and the driving voltage line DVL may include molybdenum (Mo), aluminum (Al), copper (Cu) silver (Ag), chromium (Cr), tantalum (Ta), titanium (Ti), and the like, and may include a single layer or a multilayer structure including the same. For example, the first conductive layer BL1 and the driving voltage line DVL may include a two-layer structure including a first layer including titanium and a second layer including copper.

A buffer layer BF may be positioned or disposed on the first metal layer BL1 and the driving voltage line DVL. The buffer layer BF may include a silicon oxide ($SiO_x$), a silicon nitride ($SiN_x$), or a silicon oxynitride ($SiO_xN_y$). The buffer layer BF may overlap an entire surface of the substrate SUB.

A semiconductor layer ACT1 may be disposed on the buffer layer BF. The semiconductor layer ACT1 may include a first region P1 electrically connected to the driving voltage line DVL, a second region Q1 electrically connected to the anode of a light emitting element to be described later, and a channel region C1 positioned or disposed between the first region P1 and the second region Q1.

A gate electrode GE1 may be positioned or disposed on the semiconductor layer ACT1, for example on the channel region C1. The gate electrode GE1 may include molybdenum (Mo), aluminum (Al), copper (Cu) silver (Ag), chromium (Cr), tantalum (Ta), titanium (Ti), and the like, and may include a single layer or a multilayer structure including the same.

A first insulating layer IL1 may be positioned or disposed between the gate electrode GE1 and the channel region C1. The first insulating layer IL1 may include a silicon oxide ($SiO_x$), a silicon nitride ($SiN_x$), or a silicon oxynitride ($SiO_xN_y$). The first insulating layer IL1 may be formed to have substantially a same edge as that of the gate electrode GE1, but the disclosure is not limited thereto, and it may be formed to overlap the entire surface of the substrate SUB.

A second insulating layer IL2 may be disposed on the gate electrode GE1. An upper storage electrode UE and an auxiliary driving voltage line DVLb electrically connected to the first region P1 may be positioned or disposed on the second insulating layer IL2. A detailed description thereof will be given later.

According to an embodiment, the first metal layer BL1 may overlap the channel region C1 and the second region Q1 of the semiconductor layer ACT1. The channel region C1 and the second region Q1 of the semiconductor layer ACT1 may be positioned or disposed on the first metal layer BL1 along a third direction (stacking direction). The semiconductor layer ACT1 may include a region that does not overlap the first conductive layer BL1 along the third direction DR3. The region may be positioned between the first region P1 and the channel region C1, and for example, may be a part of the first region P1. The driving voltage line DVL may overlap a portion of the semiconductor layer ACT1, and for example, it may overlap at least a portion of the first region P1. The first metal layer BL1 and the driving voltage line DVL overlapping the semiconductor layer ACT1 may be spaced apart from each other.

The auxiliary driving voltage line DVLb may be electrically connected to the first region P1 through a first contact hole C11 of the second insulating layer IL2. The upper storage electrode UE may be electrically connected to the second region Q1 through a second contact hole C12 of the second insulating layer IL2.

Particles formed in the semiconductor layer ACT1 may penetrate into the buffer layer BF during a process of forming the first and second contact holes C11 and C12 on the second insulating layer IL2. Cracks may be generated in the semiconductor layer ACT1 and the buffer layer BF, and the auxiliary driving voltage line DVLb or the upper storage electrode UE may extend to the first conductive layer BL1. According to an embodiment, the driving voltage line DVL and the first metal layer BL1 are spaced apart from each other, and thus occurrence of a short circuit may be prevented and occurrence of a defect may be controlled.

Figure 3A:
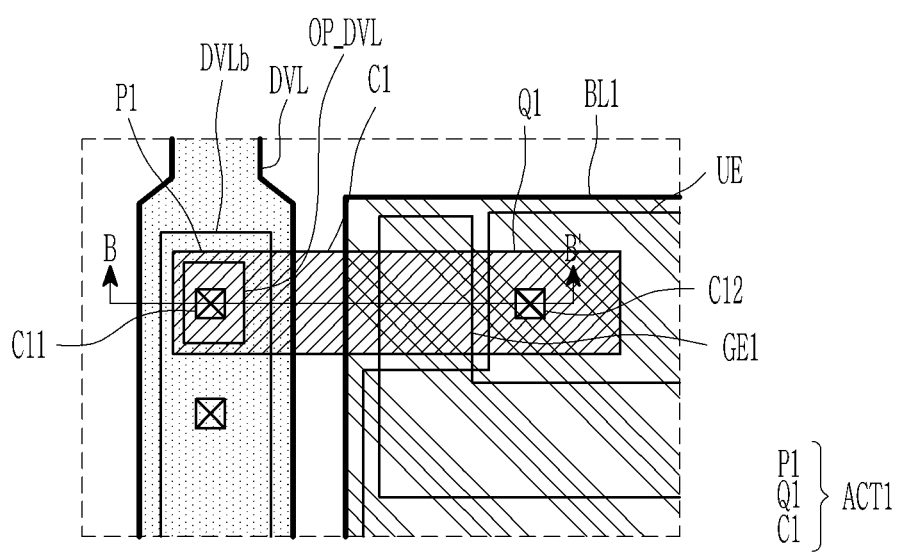
FIG. 3A illustrates a schematic top plan view of a transistor.
Figure 3B:
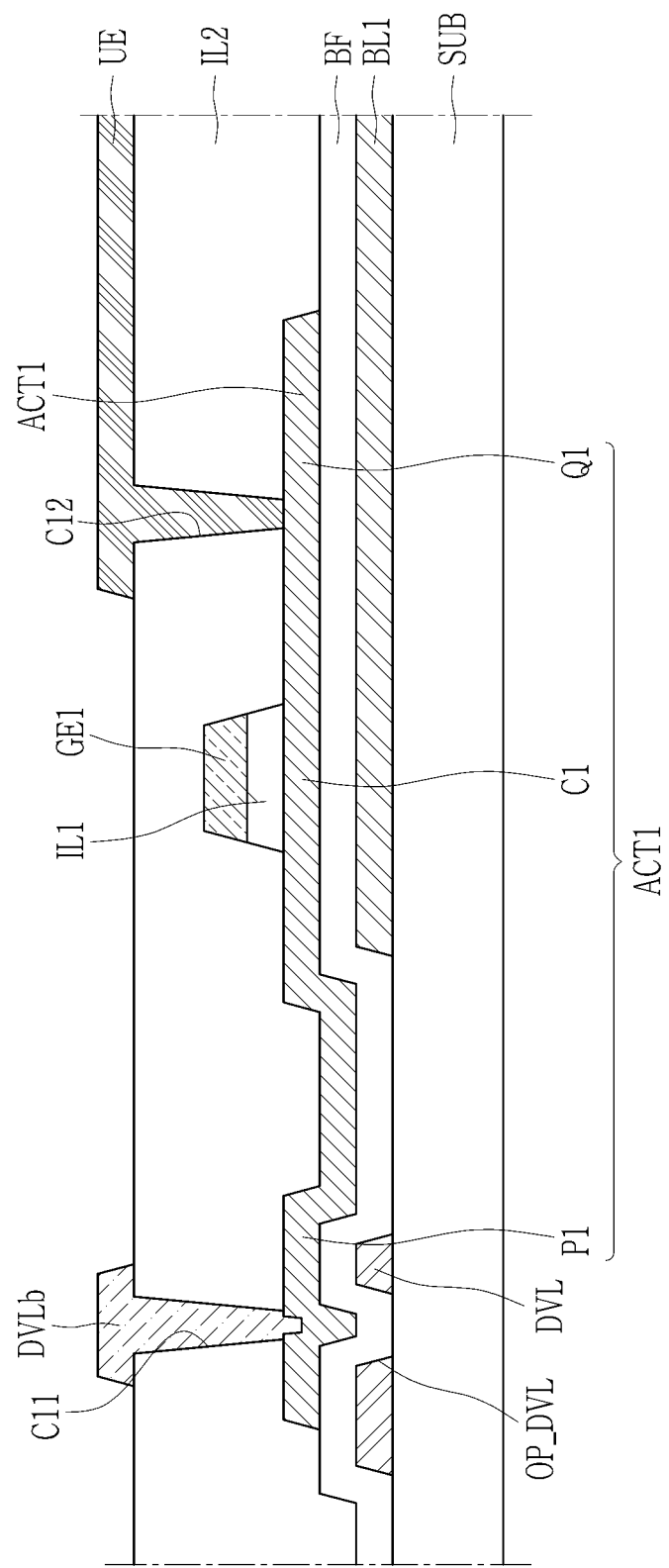
FIG. 3B illustrates a schematic cross-sectional view taken along a line B-B' of FIG. 3A.

A transistor according to an embodiment will be described with reference to FIG. 3A and FIG. 3B. FIG. 3A illustrates a schematic top plan view of a transistor, and FIG. 3B illustrates a schematic cross-sectional view taken along a line B-B' of FIG. 3A. A description of the constituent elements described in FIG. 2A and FIG. 2B will be omitted.

According to an embodiment, the driving voltage line DVL positioned or disposed on the first conductive layer may have an opening OP_DVL. The opening OP_DVL may overlap the first contact hole C11. The auxiliary driving voltage line DVLb may be electrically connected to the first region P1 through the first contact hole C11.

Particles formed in the semiconductor layer ACT1 may penetrate into the buffer layer BF during a process of forming the first contact hole C11. Cracks may be generated in the semiconductor layer ACT1 and the buffer layer BF, and an auxiliary driving voltage line DVLb formed thereafter may extend through the semiconductor layer ACT1 and the buffer layer BF. Since the driving voltage line DVL according to an embodiment may include the opening OP_DVL, unnecessary electrical connection may be prevented. Since the driving voltage line DVL and the first metal layer BL1 positioned or disposed in the first conductive layer are spaced apart from each other, occurrence of a short circuit may be prevented and occurrence of a defect may be controlled.

Figure 4:
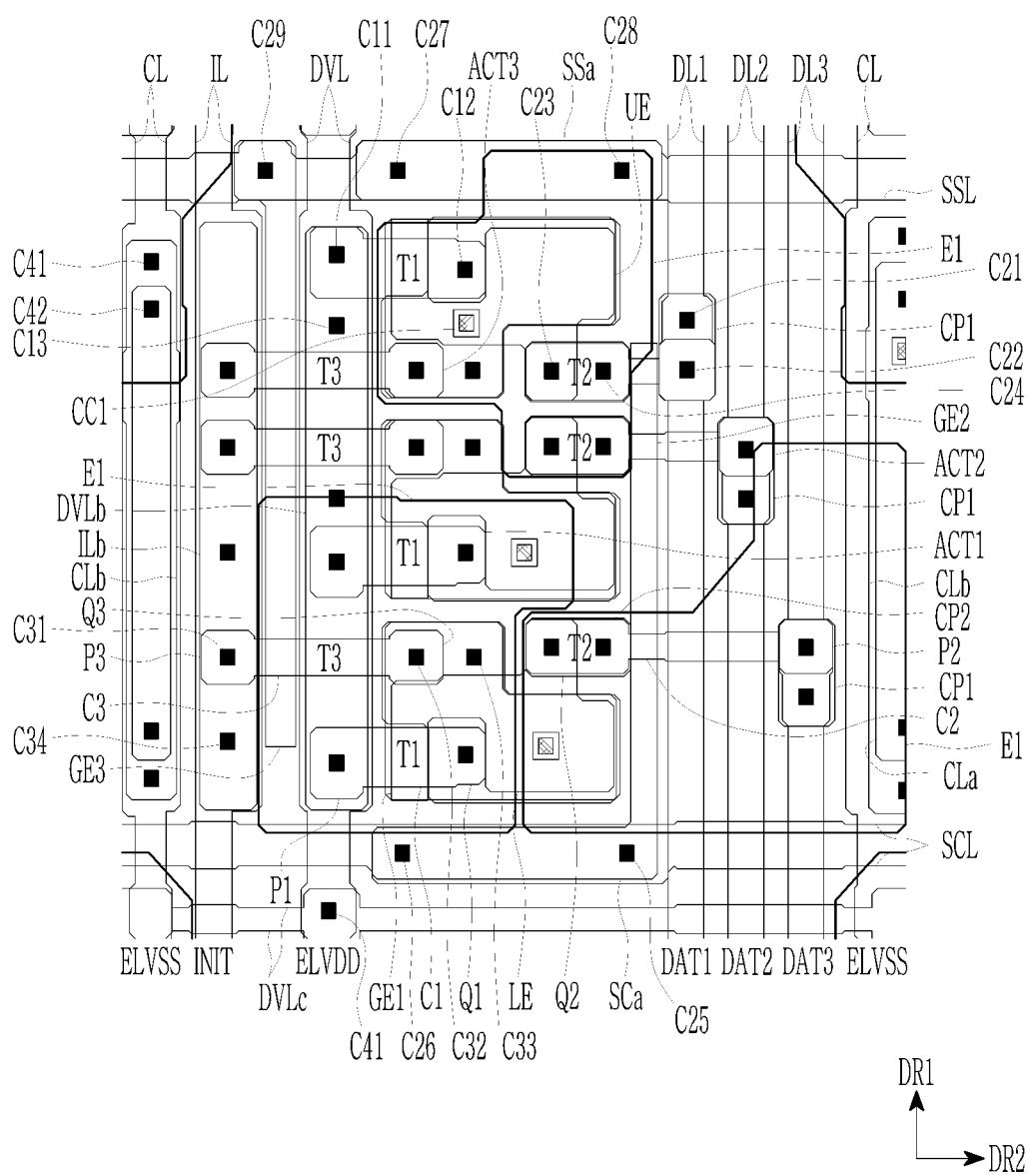
FIG. 4 illustrates a layout view of a pixel according to an embodiment.
Figure 5:
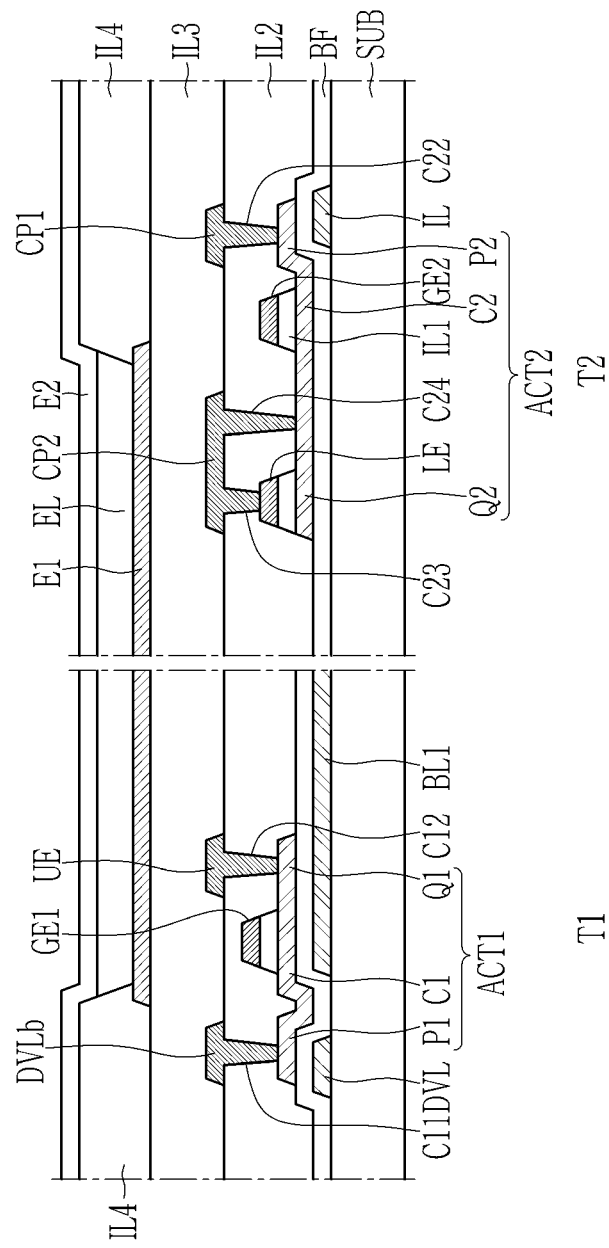
FIG. 5 illustrates a schematic cross-sectional view of a region according to an embodiment.

Hereinafter, arrangements of pixels according to an embodiment will be described with reference to FIG. 4 to FIG. 9. FIG. 4 illustrates a layout view of a pixel according to an embodiment, FIG. 5 illustrates a schematic cross-sectional view of a region according to an embodiment, and FIG. 6, FIG. 7, FIG. 8, and FIG. 9 each illustrates a layout view of pixels showing constituent elements. Although the specification has described an embodiment in which an embodiment of FIG. 2A and FIG. 2B is reflected, the disclosure is not limited thereto, and an embodiment of FIG. 3A and FIG. 3B may be applied to the pixel arrangements. A description of the same or similar continent elements as those described above will be omitted.

Figure 6:
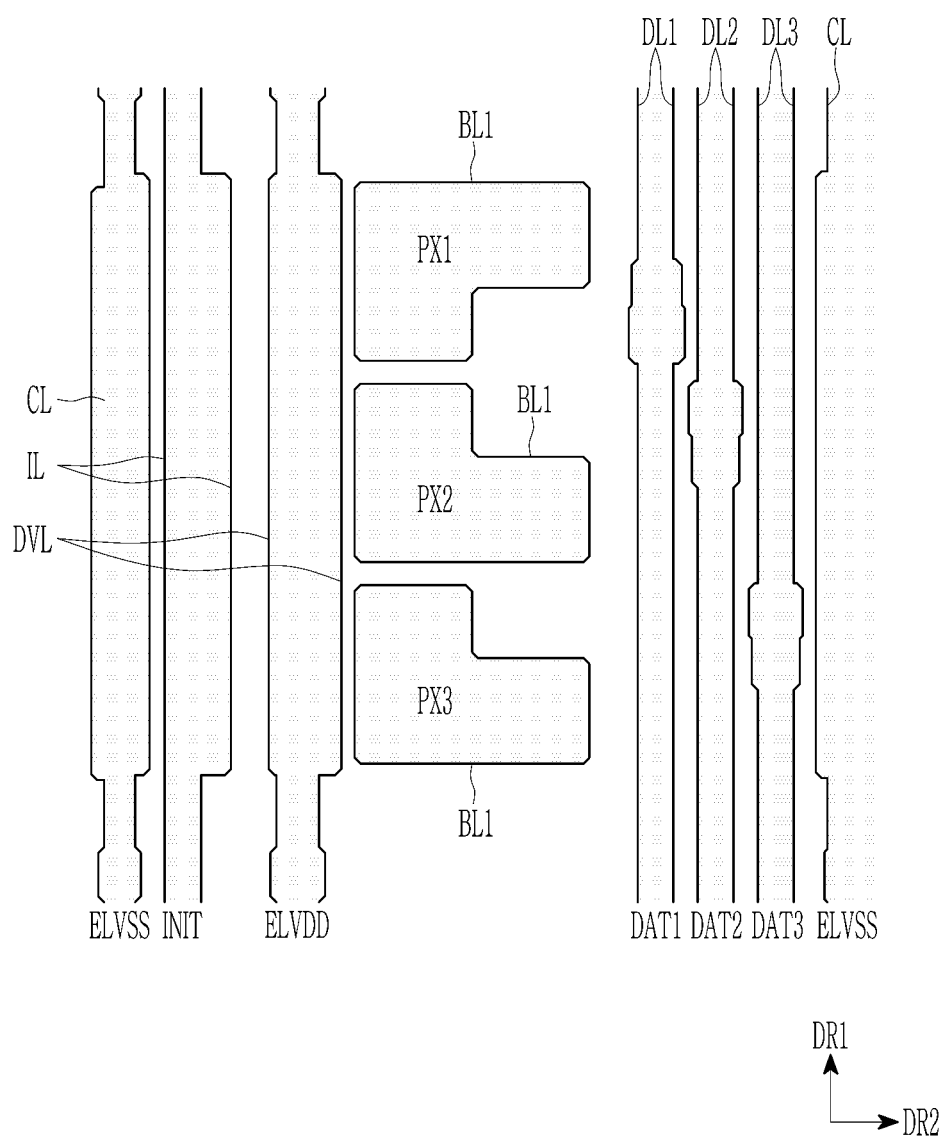
FIG. 6, FIG. 7, FIG. 8, and FIG. 9 each illustrates a layout view of pixels showing constituent elements.

Referring first to FIG. 5 and FIG. 6 as well as FIG. 4, a display device according to an embodiment may include a substrate SUB. The substrate SUB may include an insulating material such as glass, plastic, or the like, and may have flexibility.

A first conductive layer including a first data line DL1, a second data line DL2, and a third data line DL3 may be disposed on the substrate SUB. FIG. 6 illustrates a first conductive layer.

The first data line DL1, the second data line DL2, and the third data line DL3 may be extended in a first direction DR1. The first data line DL1, the second data line DL2, and the third data line DL3 may be formed to have a substantially bar shape having a predetermined width and extending along the first direction DR1. The first data line DL1, the second data line DL2, and the third data line DL3 may be positioned or disposed to be adjacent along a second direction DR2 crossing or intersecting the first direction DR1. The first data line DL1, the second data line DL2, and the third data line DL3 may be positioned or disposed to be spaced apart at a predetermined interval. Different data voltages DAT1, DAT2, and DAT3 may be applied to the first data line DL1, the second data line DL2, and the third data line DL3, and they may be spaced apart to prevent a short circuit therebetween. The first direction DR1 may be a column direction, and the second direction DR2 may be a row direction. The first direction DR1 and the second direction DR2 may be perpendicular to each other. The second data line DL2 may be adjacent to a right side of the first data line DL1, and the third data line DL3 may be adjacent to a right side of the second data line DL2. An expression that the data lines DL1, DL2, and DL3 are positioned or disposed adjacent to each other indicates that no other wire extending in a direction parallel to the data lines DL1, DL2, and DL3 may be positioned or disposed between the data lines DL1, DL2, and DL3. For example, no other wire extending in a direction parallel to the first data line DL1 and the second data line DL2 which are adjacent to each other may be positioned therebetween. No other wire may be positioned between the second data line DL2 and the third data line DL3 adjacent to each other.

The first conductive layer may further include a common voltage line CL, an initialization voltage line IL, a driving voltage line DVL, and a first metal layer BL1.

The common voltage line CL, the initialization voltage line IL, and the driving voltage line DVL may extend in the first direction DR1. The common voltage line CL, the initialization voltage line IL, and the driving voltage line DVL may extend in a direction parallel to the first to third data lines DL1, DL2, and DL3. The common voltage line CL, the initialization voltage line IL, and the driving voltage line DVL may be positioned or disposed to be adjacent along the second direction DR2. The common voltage line CL, the initialization voltage line IL, and the driving voltage line DVL may be positioned or disposed to be separated by a predetermined interval. The common voltage ELVSS may be applied to the common voltage line CL, the initialization voltage INIT may be applied to the initialization voltage line IL, and the driving voltage ELVDD may be applied to the driving voltage line DVL. The common voltage ELVSS may be applied to the common voltage line CL, the initialization voltage INIT may be applied to the initialization voltage line IL, and the driving voltage ELVDD may be applied to the driving voltage line DVL. The initialization voltage line IL may be positioned or disposed between the common voltage line CL and the driving voltage line DVL. However, their positions are not limited thereto, and may be changed.

The first metal layer BL1 may be positioned or disposed between the driving voltage line DVL and the first data line DL1 in a plan view. Each of the first to third pixels PX1, PX2, and PX3 may include a first metal layer BL1, and the first metal layers BL1 may be positioned or disposed to be adjacent along the first direction DR1. In a plan view, the first metal layer BL1 of the second pixel PX2 may be disposed under or below the first metal layer BL1 of the first pixel PX1, and the first metal layer BL1 of the third pixel PX3 may be disposed under or below the first metal layer BL1 of the second pixel PX2.

A substantially planar shape of the first metal layer BL1 may be substantially polygonal. Substantially planar shapes of the first metal layers BL1 of the pixels PX1, PX2, and PX3 may be the same or different. For example, substantially planar shapes of the first metal layers BL1 of the first pixel PX1 and the second pixel PX2 may be symmetrical to each other, and substantially planar shapes of the first metal layers BL1 of the second pixel PX2 and the third pixel PX3 may be the same. The first metal layer BL1 may be spaced apart from the driving voltage line DVL in a plan view.

The first conductive layer may include molybdenum (Mo), aluminum (Al), copper (Cu), silver (Ag), chromium (Cr), tantalum (Ta), titanium (Ti), and the like, and may include a single layer or a multilayer structure including the same. For example, the first conductive layer may include a two-layer structure including a first layer including titanium and a second layer including copper.

A buffer layer BF, which is an insulating layer, may be disposed on the first conductive layer, which may include a first data line DL1, a second data line DL2, a third data line DL3, a common voltage line CL, an initialization voltage line IL, a driving voltage line DVL, and a first metal layer BL1.

Figure 7:
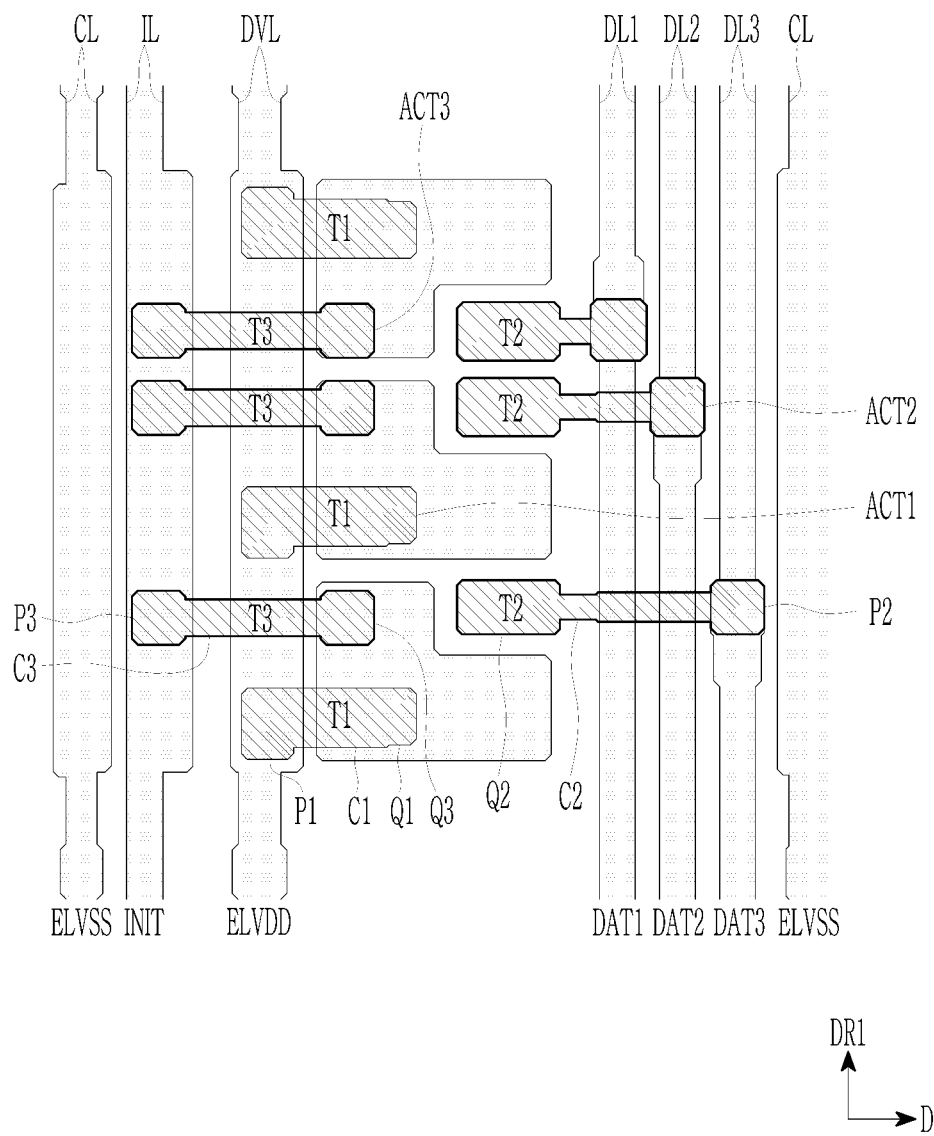

Referring to FIG. 4, FIG. 5, and FIG. 7, a first semiconductor layer ACT1 including a channel region C1, a first region P1, and a second region Q2 of the first transistor T1, a second semiconductor layer ACT2 including a channel region C2, a first region P2, and a second region Q2 of the second transistor T2, and a third semiconductor layer ACT3 including a channel region C3, a first region P3, and a second region Q3 of the third transistor T3 of the first to third pixels PX1, PX2, and PX3 may be disposed on the buffer layer BF. FIG. 7 illustrates the first conductive layer and a semiconductor layer. The semiconductor layer may include a semiconductor material such as amorphous silicon, polysilicon, or an oxide semiconductor.

The channel region C1, the first region P1, and the second region Q1 of the driving transistor T1 may have a substantially bar shape extending in the second direction DR2. The channel region C1 of the driving transistor T1 may be positioned or disposed between the first region P1 and the second region Q1. The first region P1 of the driving transistor T1 may overlap the driving voltage line DVL. The first region P1 of the driving transistor T1 may be electrically connected to the driving voltage line DVL, and may receive the driving voltage ELVDD from the driving voltage line DVL. However, the first region P1 of the driving transistor T1 may not be connected to or directly connected to the driving voltage line DVL. The first semiconductor layer ACT1 of the driving transistor T1 may overlap the first conductive layer. For example, the first region P1 may overlap the driving voltage line DVL, and the channel region C1 and the second region Q1 may overlap the first metal layer BL1.

The driving transistors T1 of the first to third pixels PX1, PX2, and PX3 may be sequentially positioned or disposed along the first direction DR1. For example, in a plan view, the driving transistor T1 of the second pixel PX2 may be positioned or disposed under or below the driving transistor T1 of the first pixel PX1, and the driving transistor T1 of the third pixel PX3 may be positioned or disposed under or below the driving transistor T1 of the second pixel PX2.

The channel region C2, the first region P2, and the second region Q2 of the switching transistor T2 may have a substantially bar shape extending in the second direction DR2. The channel region C2 of the switching transistor T2 may be positioned or disposed between the first region P2 and the second region Q2. The first region P2 of the switching transistor T2 may overlap the data lines DL1, DL2, and DL3, and may be electrically connected to the data lines DL1, DL2, and DL3. The first region P2 of the switching transistor T2 of the first pixel PX1 may be electrically connected to the first data line DL1. The first region P2 of the switching transistor T2 of the second pixel PX2 may be electrically connected to the second data line DL2. The first region P2 of the switching transistor T2 of the third pixel PX3 may be electrically connected to the third data line DL3. The first regions P2 of the switching transistors T2 of the first to third pixels PX1, PX2, and PX3 may not be connected to or directly connected to the respective data lines DL1, DL2, and DL3.

The switching transistors T2 of the first to third pixels PX1, PX2, and PX3 may be sequentially positioned or disposed along the first direction DR1. For example, in a plan view, the switching transistor T2 of the second pixel PX2 may be positioned or disposed under or below the switching transistor T2 of the first pixel PX1, and the switching transistor T2 of the third pixel PX3 may be positioned or disposed under or below the switching transistor T2 of the second pixel PX2. The switching transistors T2 of the first to third pixels PX1, PX2, and PX3 may be electrically connected to the different data lines DL1, DL2, and DL3.

The channel region C3, the first region P3, and the second region Q3 of the initialization transistor T3 may have a substantially bar shape extending in the second direction DR2. The channel region C3 of the initialization transistor T3 may be positioned or disposed between the first region P3 and the second region Q3. The first region P3 of the initialization transistor T3 may overlap the initialization voltage line IL. The first region P3 of the initialization transistor T3 may be electrically connected to the initialization voltage line IL to receive the initialization voltage INIT. However, the first region P3 of the initialization transistor T3 may not be connected to or directly connected to the initialization voltage line IL.

The initialization transistors T3 of the first to third pixels PX1, PX2, and PX3 may be sequentially positioned or disposed along the first direction DR1. For example, in a plan view, the initialization transistor T3 of the second pixel PX2 may be positioned or disposed under or below the initialization transistor T3 of the first pixel PX1, and the initialization transistor T3 of the third pixel PX3 may be positioned or disposed under or below the initialization transistor T3 of the second pixel PX2.

A first insulating layer IL1 may be positioned or disposed on the semiconductor layers ACT1, ACT2, and ACT3 including the channel region C1, the first region P1, and the second region Q1 of the driving transistor T1, the channel region C2, the first region P2, and the second region Q2 of the switching transistor T2, and the channel region C3, the first region P3, and the second region Q3 of initialization transistor T3.

Figure 8:
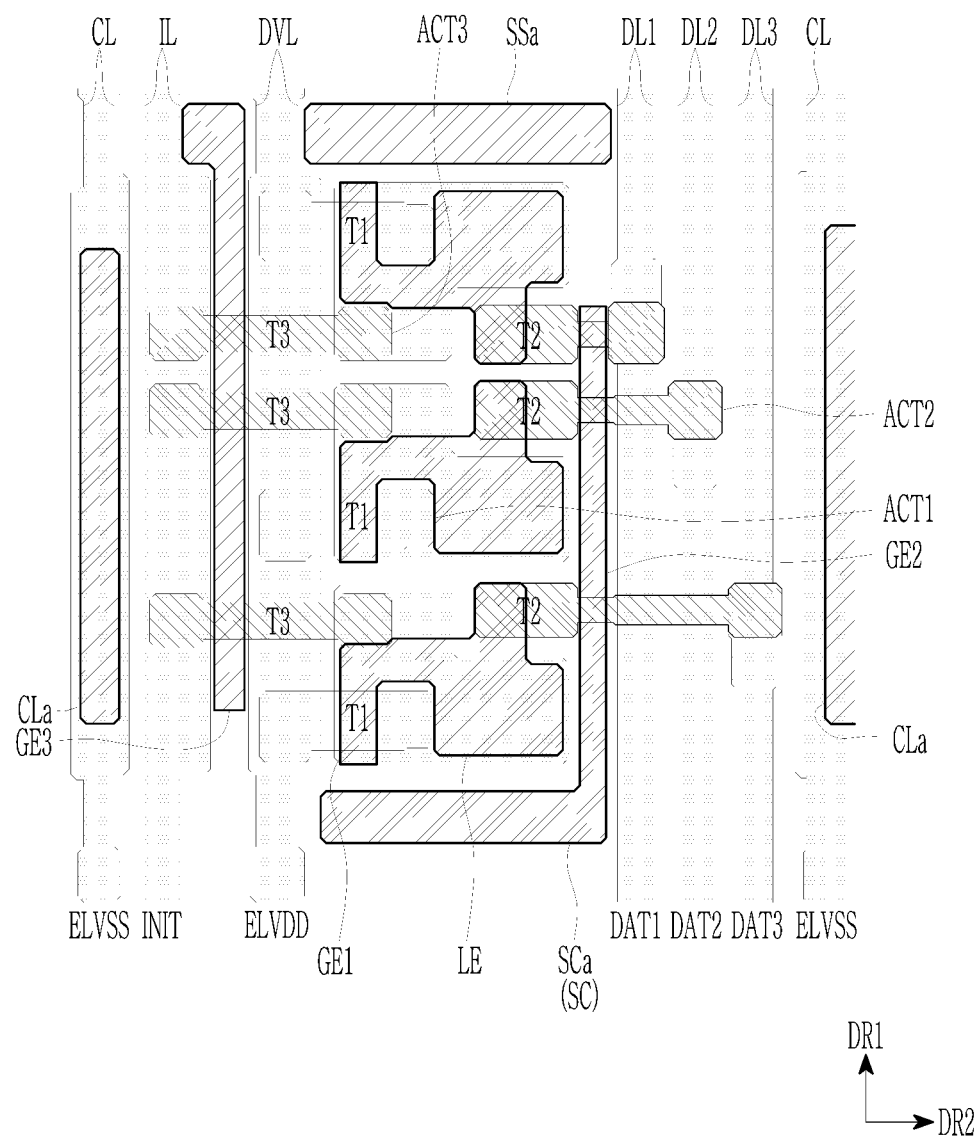

Referring to FIG. 4, FIG. 5, and FIG. 8, the second conductive layer including the gate electrode GE1 of the driving transistor T1, the gate electrode GE2 of the switching transistor T2, the gate electrode GE3 of the initialization transistor T3, and a lower storage electrode LE may be positioned or disposed on the first insulating layer ILL FIG. 7 illustrates the first conductive layer, the semiconductor layer, and the second conductive layer.

The gate electrode GE1 of the driving transistor T1 may overlap the channel region C1 of the driving transistor T1. The gate electrode GE1 of the driving transistor T1 may be electrically connected to the lower storage electrode LE, and may be integral with each other. The lower storage electrode LE may overlap the second region Q2 of the switching transistor T2. The lower storage electrode LE may be electrically connected to the second region Q2 of the switching transistor T2. However, the lower storage electrode LE may not be connected to or directly connected to the second region Q2 of the switching transistor T2.

A substantially planar shape of the lower storage electrode LE may be substantially polygonal. Substantially planar shapes of the lower storage electrodes LE of the first to third pixels PX1, PX2, and PX3 may be the same or different. For example, substantially planar shapes of the lower storage electrodes LE of the first pixel PX1 and the second pixel PX2 may be symmetrical to each other, and substantially planar shapes of the lower storage electrodes LE of the second pixel PX2 and the third pixel PX3 may be the same.

The gate electrode GE2 of the switching transistor T2 may overlap the channel region C2 of the switching transistor T2. The gate electrodes GE2 of the switching transistors T2 of the first to third pixels PX1, PX2, and PX3 may be electrically connected to each other, and may be integral with each other. Accordingly, the same first scan signal SC may be applied to the gate electrodes GE2 of the switching transistors T2 of the first to third pixels PX1, PX2, and PX3. The gate electrodes GE2 of the switching transistor T2 electrically connected to each other may have a substantially bar shape extending in the first direction DR1.

The gate electrode GE3 of the initialization transistor T3 may overlap the channel region C3 of the initialization transistor T3. The gate electrodes GE3 of the initialization transistors T3 of the first to third pixels PX1, PX2, and PX3 may be electrically connected to each other, and may be integral with each other. Accordingly, the same second scan signal SS may be applied to the gate electrodes GE3 of the initialization transistors T3 of the first to third pixels PX1, PX2, and PX3. The gate electrodes GE3 of the initialization transistor T3 electrically connected to each other may have a substantially bar shape extending in the first direction DR1.

A doping process may be performed after the second conductive layer is formed. The semiconductor layer that is covered or overlapped by the second conductive layer may be hardly doped, and a portion of the semiconductor layer that is not covered or overlapped by the second conductive layer may be doped to have a same characteristic as that of a conductor. For example, the channel region C1 of the driving transistor T1, the channel region C2 of the switching transistor T2, and the channel region C3 of the initialization transistor T3, which are covered or overlapped by the second conductive layer, may not be doped or may be hardly doped. The first region P1 and the second region Q1 of the driving transistor T1, the first region P2 and the second region Q2 of the switching transistor T2, and the first region P3 and the second region Q3 of the initialization transistor T3, which may not be covered or overlapped by the second conductive layer, may be doped to have a same characteristic as that of a conductor.

A second insulating layer IL2 may be disposed on the second conductive layer.

Figure 9:
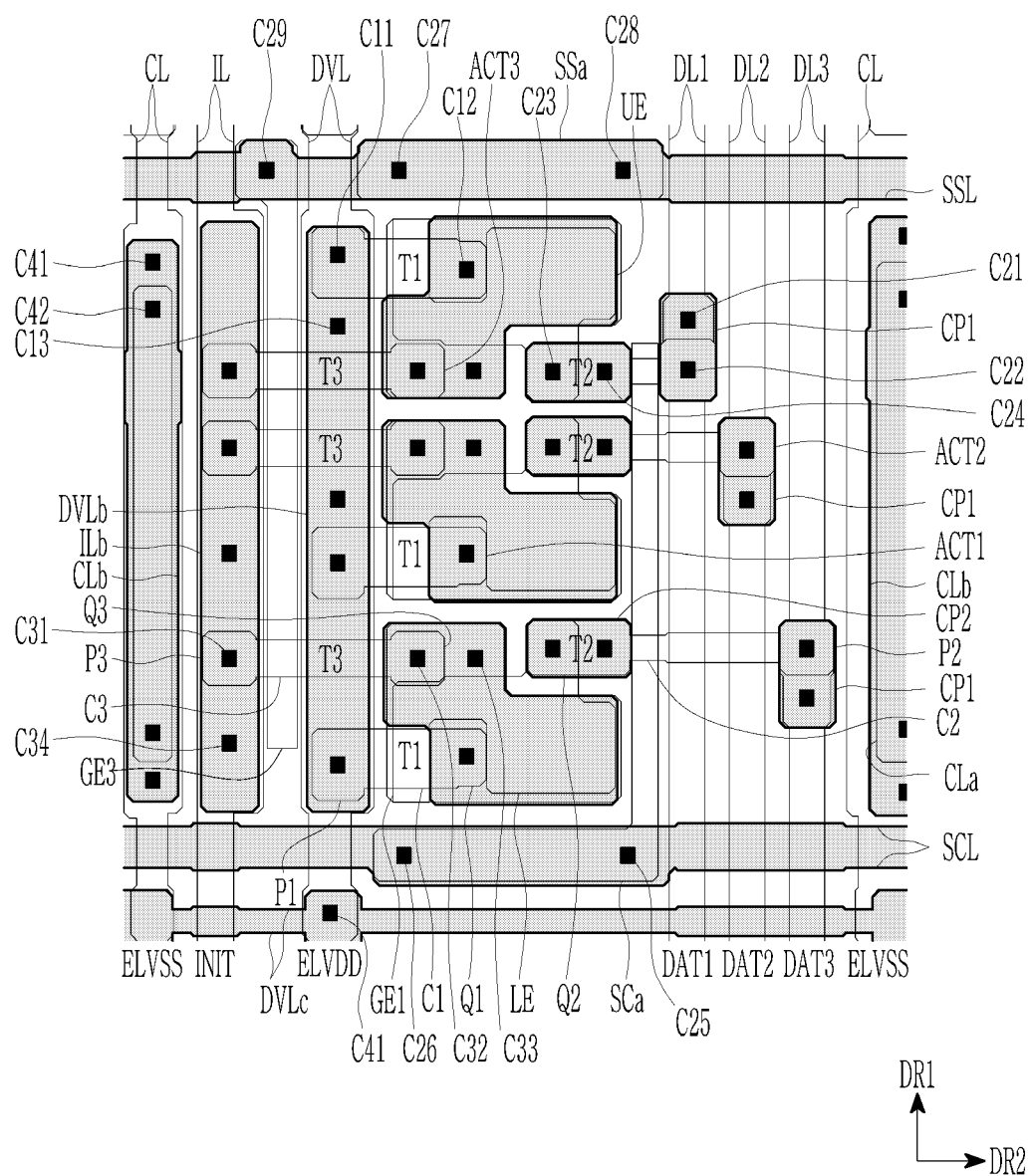

Referring to FIG. 4, FIG. 5, and FIG. 9, a third conductive layer may be disposed on the second insulating layer IL2. The third conductive layer may include a first scan line SCL, a second scan line SSL, an upper storage electrode UE, a first connection pattern CP1, a second connection pattern CP2, a third connection pattern CLb, a fourth connection pattern ILb, a fifth connection pattern DVLb, and an auxiliary driving voltage line DVLc.

The first scan line SCL may extend in the second direction DR2. The first scan line SCL may intersect the data lines DL1, DL2, and DL3, and the first scan line SCL and the data lines DL1, DL2, and DL3 may overlap at intersections thereof. The first scan line SCL may overlap a first auxiliary scan pattern SCa positioned or disposed on the second conductive layer.

The first scan line SCL may be electrically connected to the first auxiliary scan pattern SCa through contact holes C25 and C26. The first auxiliary scan pattern SCa may serve to reduce resistance of the first scan line SCL. The first auxiliary scan pattern SCa may not overlap the data lines DL1, DL2, and DL3. The first scan line SCL may have a shape extending from a first end to a second end of the substrate SUB. The first auxiliary scan pattern SCa may have a length corresponding to a region between the driving voltage line DVL and the first data line DLL A first scan signal SC may be applied to the first scan line SCL. The first scan line SCL may be electrically connected to the gate electrode GE2 of the switching transistor T2 through the first auxiliary scan pattern SCa. Accordingly, the gate electrode GE2 of the switching transistor T2 may receive the first scan signal SC from the first scan line SCL.

The second scan line SSL may extend in the second direction DR2. The second scan line SSL may intersect the data lines DL1, DL2, and DL3, and the second scan line SSL and the data lines DL1, DL2, and DL3 may overlap at intersections thereof. The second scan line SSL may overlap a second auxiliary scan pattern SSa positioned or disposed on the second conductive layer. The second scan line SSL may be electrically connected to the second auxiliary scan pattern SSa through contact holes C27 and C28. The second auxiliary scan pattern SSa may serve to reduce resistance of the second scan line SSL. The second auxiliary scan pattern SSa may not overlap the data lines DL1, DL2, and DL3. The second scan line SSL may have a shape extending from a first end to a second end of the substrate SUB. The second auxiliary scan pattern SSa may have a length corresponding to a region between the driving voltage line DVL and the first data line DL1. A second scan signal SS may be applied to the second scan line SSL. The second scan line SSL may be electrically connected to the gate electrode GE3 of the initialization transistor T3 through a contact hole C29. Accordingly, the gate electrode GE3 of the initialization transistor T3 may receive the second scan signal SS from the second scan line SSL.

The upper storage electrode UE may overlap the lower storage electrode LE. The lower storage electrode LE and the upper storage electrode UE may overlap each other with the second insulating layer IL2 interposed or disposed therebetween to form a capacitor Cst. Since the lower storage electrode LE may also overlap the first metal layer BL1 with the first insulating layer IL1 therebetween, the capacitor Cst may be doubly formed. The first metal layer BL1 may function as a storage electrode. Accordingly, the capacitor capacitance may be increased even in a narrow area.

The upper storage electrode UE may overlap the second region Q1 of the driving transistor T1. The second insulating layer IL2 may have a contact hole C12 overlapping the upper storage electrode UE and the second region Q1 of the driving transistor T1. The upper storage electrode UE may be electrically connected to the second region Q1 of the driving transistor T1 through a contact hole C12. The upper storage electrode UE may be electrically connected to the anode of a light emitting element through a contact hole C33.

The upper storage electrode UE may overlap the second region Q3 of the initialization transistor T3. The upper storage electrode UE and the second region Q3 of the initialization transistor T3 may be electrically connected through a contact hole C32 overlapping the upper storage electrode UE and the second region Q3 of the initialization transistor T3.

Each of the first to third pixels PX1, PX2, and PX3 may include an upper storage electrode UE, a lower storage electrode LE, and a first metal layer BL1. The upper storage electrode UE, the lower storage electrode LE, and the first metal layer BL1 of each of the first to third pixels PX1, PX2, and PX3 may be positioned or disposed between the first scan line SCL and the second scan line SSL in a plan view. The upper storage electrode UE, the lower storage electrode LE, and the first metal layer BL1 of each of the first to third pixels PX1, PX2, and PX3 may be positioned or disposed between the first scan line SCL and the first data line DL1 in a plan view. For example, the upper storage electrode UE, the lower storage electrode LE, and the first metal layer BL1 of each of the first to third pixels PX1, PX2, and PX3 may be surrounded by the first scan line SCL, the second scan line SSL, the driving voltage line DVL, and the first data line DL1 in a plan view. The upper storage electrodes UE of the first to third pixels PX1, PX2, and PX3 may be positioned or disposed adjacent to each other along the first direction DR1. In a plan view, the upper storage electrode UE of the second pixel PX2 may be positioned or disposed under or below the upper storage electrode UE of the first pixel PX1, and the upper storage electrode UE of the third pixel PX3 may be positioned or disposed under or below the upper storage electrode UE of the second pixel PX2. The lower storage electrodes LE of the first to third pixels PX1, PX2, and PX3 may be positioned or disposed adjacent to each other along the first direction DR1. In a plan view, the lower storage electrode LE of the second pixel PX2 may be positioned or disposed under or below the lower storage electrode LE of the first pixel PX1, and the lower storage electrode LE of the third pixel PX3 may be positioned or disposed under or below the lower storage electrode LE of the second pixel PX2.

A substantially planar shape of the upper storage electrode UE may be substantially polygonal. Substantially planar shapes of the upper storage electrodes UE of the first to third pixels PX1, PX2, and PX3 may be the same or different. For example, substantially planar shapes of the upper storage electrodes UE of the first pixel PX1 and the second pixel PX2 may be symmetrical to each other, and substantially planar shapes of the upper storage electrodes UE of the second pixel PX2 and the third pixel PX3 may be the same.

Each of the pixels PX1, PX2, and PX3 may include a first connection pattern CP1. The first connection pattern CP1 of each of the pixels PX1, PX2, and PX3 may overlap each of the data lines DL1, DL2, and DL3. The second insulating layer IL2 may include a first connection pattern CP1 and contact holes C21 and C22 overlapping each of the data lines DL1, DL2, and DL3. The first connection pattern CP1 may be electrically connected to the data lines DL1, DL2, and DL3 through the contact hole C21, and may be electrically connected to the first region P2 of the switching transistor T2 through the contact hole C22. The first connection pattern CP1 may electrically connect between the data lines DL1, DL2, and DL3 and the first region P2 of the switching transistor T2. In the first pixel PX1, the first connection pattern CP1 may electrically connect between the first data line DL1 and the first region P2 of the switching transistor T2. In the second pixel PX2, the first connection pattern CP1 may electrically connect between the second data line DL2 and the first region P2 of the switching transistor T2. In the third pixel PX3, the first connection pattern CP1 may electrically connect between the third data line DL3 and the first region P2 of the switching transistor T2.

Each of the pixels PX1, PX2, and PX3 may include a second connection pattern CP2. The second connection pattern CP2 of each of the pixels PX1, PX2, and PX3 may overlap the second region Q2 of the switching transistor T2. The second connection pattern CP2 may be electrically connected to the second region Q2 of the switching transistor T2 through a contact hole C24. The second connection pattern CP2 may be electrically connected to the second region Q2 of the switching transistor T2 through the contact hole C24. The second connection pattern CP2 may be electrically connected to the lower storage electrode LE through a contact hole C23. Accordingly, in each of the pixels PX1, PX2, and PX3, the second connection pattern CP2 may electrically connect between the second region Q2 of the switching transistor T2 and the lower storage electrode LE.

The third connection pattern CLb may overlap the common voltage line CL. The third connection pattern CLb may have a substantially bar shape extending in the first direction DR1. The common voltage line CL may have a shape extending from the first end of the substrate SUB to the second end of the substrate SUB. The third connection pattern CLb may be electrically connected to the common voltage line CL and the common voltage auxiliary pattern CLa through contact holes C41 and C42, to serve to reduce resistance of the common voltage line CL.

The fourth connection pattern ILb may overlap the initialization voltage line IL. The fourth connection pattern ILb may be electrically connected to the initialization voltage line IL through a contact hole C34. The fourth connection pattern ILb may serve to reduce resistance of the initialization voltage line IL. The fourth connection pattern ILb may have a substantially bar shape extending in the first direction DR1. The fourth connection pattern ILb may overlap the first region P3 of the third transistor T3. The fourth connection pattern ILb may be electrically connected to the first region P3 of the third transistor T3 through a contact hole C31. The fourth connection pattern ILb may electrically connect the initialization voltage line IL and the first region P3 of the third transistor T3. The first region P3 of the third transistor T3 may receive the initialization voltage INIT.

The fifth connection pattern DVLb may overlap the driving voltage line DVL. The fifth connection pattern DVLb may be electrically connected to the driving voltage line DVL through a contact hole C13. The fifth connection pattern DVLb may serve to reduce resistance of the driving voltage line DVL. The fifth connection pattern DVLb may have a substantially bar shape extending in the first direction DR1. The fifth connection pattern DVLb may repeat a broken shape for each of the three pixels PX1, PX2, and PX3. The fifth connection pattern DVLb may be electrically connected to the first region P1 of the first transistor T1 through the contact hole C11. The fifth connection pattern DVLb may electrically connect the driving voltage line DVL and the first region P1 of the first transistor T1.

The auxiliary driving voltage line DVLc may extend in the second direction DR2. The auxiliary driving voltage line DVLc may cross or intersect the driving voltage line DVL, and the auxiliary driving voltage line DVLc and the driving voltage line DVL may overlap at an intersection thereof. The auxiliary driving voltage line DVLc may be electrically connected to the driving voltage line DVL through the contact hole C41. The driving voltage ELVDD may be applied to the auxiliary driving voltage line DVLc. The auxiliary driving voltage line DVLc may serve to reduce resistance of the driving voltage line DVL.

A third insulating layer IL3 may be disposed on the third conductive layer.

At least one of the first conductive layer, the second conductive layer, and the third conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. Each of the first conductive layer, the second conductive layer, and the third conductive layer may be formed as a single layer or multiple layers. For example, they may have a multilayer structure including a lower layer including titanium and an upper layer including copper.

At least one of the buffer layer BF, the first insulating layer IL1, the second insulating layer IL2, and the third insulating layer IL3 may include an inorganic insulating material such as a silicon nitride ($SiN_x$), a silicon oxide ($SiO_x$), and a silicon oxynitride (SiON), and/or an organic insulating material such as a polyimide, an acrylic polymer, and a siloxane polymer.

A fourth conductive layer including the first electrode E1 may be disposed on the third insulating layer IL3 as illustrated in FIG. 4 and FIG. 5.

The first electrode E1 of each of the pixels PX1, PX2, and PX3 may overlap the upper storage electrode UE. The third insulating layer IL3 may include a contact hole CC1 overlapping the first electrode E1 and the upper storage electrode UE. The first electrode E1 may be electrically connected to the upper storage electrode UE through the contact hole CC1.

The first electrode E1 of the first pixel PX may overlap some or a number of the transistors T1, T2, and T3 of the first pixel PX1. The first electrode E1 may overlap some or a number of the transistors T1, T2, and T3 of pixels other than the first pixel PX1. For example, the first electrode E1 may overlap the switching transistor T2 of the second pixel PX2. The first electrode E1 of the second pixel PX may overlap some or a number of the transistors T1, T2, and T3 of the second pixel PX2. The first electrode E1 may overlap some or a number of the transistors T1, T2, and T3 of pixels other than the second pixel PX2. For example, the first electrode E1 of the second pixel PX2 may overlap the driving transistor T1 and the initialization transistor T3 of the third pixel PX3. The first electrode E1 of the third pixel PX3 may overlap some or a number of the transistors T1, T2, and T3 of the third pixel PX3. The first electrode E1 may overlap some or a number of the transistors T1, T2, and T3 of pixels other than the third pixel PX3. The first electrode E1 may overlap at least some or a number of the first to third data lines DL1, DL2, and DL3. For example, the first electrode E1 of the third pixel PX3 may overlap the first to third data lines DL1, DL2, and DL3.

In an embodiment, the transistors T1, T2, and T3 of each of the pixels PX1, PX2, and PX3 may or may not overlap the first electrode E1. For example, each first electrode E1 may overlap other pixels.

A fourth insulating layer IL4 may be disposed on the fourth conductive layer. The fourth insulating layer IL4 may include an organic insulating material such as a polyacrylic resin and a polyimide resin. The fourth insulating layer IL4 may have an opening overlapping each first electrode E1.

An emission layer EL may be disposed on the fourth insulating layer IL4 and the first electrode E1. The emission layer EL may be disposed within an opening of the fourth insulating layer IL4. The emission layer EL may include an organic emission material or an inorganic emission material. Although it is illustrated that the emission layer EL is partially formed on the substrate SUB, the disclosure is not limited thereto. The emission layer EL may be disposed to overlap the entire surface of the substrate SUB.

A second electrode E2 may be positioned or disposed on the emission layer EL. The second electrode E2 may be entirely formed on the substrate SUB. For example, one second electrode E2 may be positioned or disposed across the pixels PX1, PX2, and PX3. The second electrode E2 may be electrically connected to the common voltage line CL through a contact hole (not shown). The common voltage ELVSS may be applied to the second electrode E2.

At least one of the fourth conductive layer and the second electrode E2 may be made of a transparent metal oxide such as an indium tin oxide (ITO), an indium zinc oxide (IZO), or the like within the spirit and the scope of the disclosure.

The first electrode E1, the emission layer EL, and the second electrode E2 of each of the pixels PX1, PX2, and PX3 may constitute a light emitting diode ED together. The first electrode E1 may be an anode, and the second electrode E2 may be a cathode.

Figure 10:
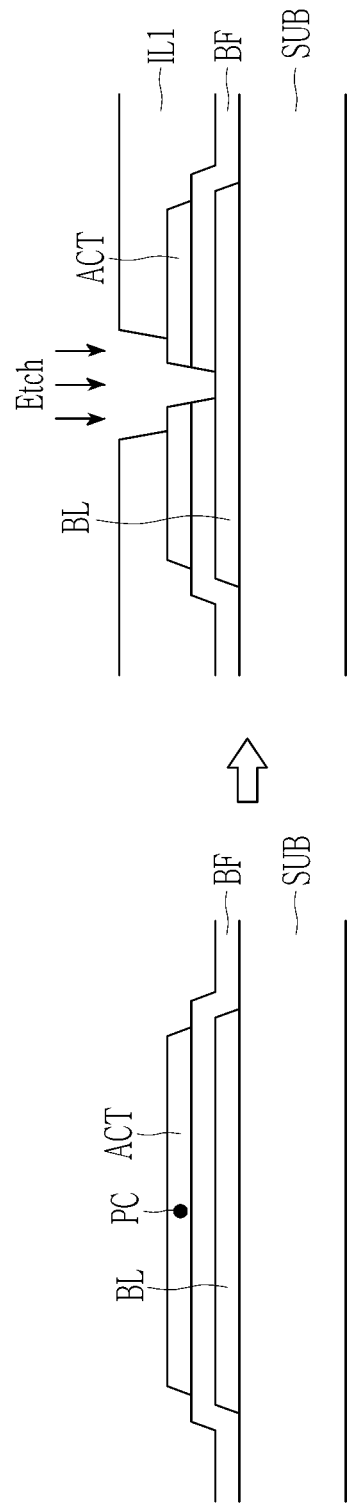
FIG. 10 illustrates a schematic cross-sectional view showing constituent elements of a transistor according to a comparative example.

A transistor of a display device according to a comparative example will be described with reference to FIG. 10. FIG. 10 illustrates a schematic cross-sectional view showing constituent elements of a transistor according to a comparative example.

According to the comparative example, the semiconductor layer ACT may include particles PC, and not only the semiconductor layer ACT but also the buffer layer BF may be etched in an etching process of forming a contact hole in the insulating layer ILL A constituent element positioned or disposed on the insulating layer IL1 may extend to the metal layer BL. In case that the metal layer BL overlaps the entire semiconductor layer ACT, a short circuit may occur in the first region and the second region with a channel region interposed therebetween. However, in the display device according to an embodiment, the first conductive layer overlapping the semiconductor layer ACT may include the driving voltage line DVL and the first metal layer BL1 spaced apart from each other, and thus even when unintended additional etching occurs due to particles, occurrence of short circuits may be prevented and occurrence of defects may be controlled.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure and the appended claims.

What is claimed is:

1. A display device comprising:
a metal layer disposed on a substrate;
a transistor disposed on the metal layer; and
a light emitting element electrically connected to the transistor, wherein
the transistor includes a semiconductor layer at least partially overlapping the metal layer,
the semiconductor layer includes a first region, a second region, and a channel region disposed between the first region and the second region,
the metal layer overlaps the second region and the channel region and is spaced apart from the first region in a plan view; and
a driving voltage line that overlaps a portion of the semiconductor layer, wherein
the driving voltage line and the metal layer are spaced apart from each other.

2. The display device of claim 1, wherein the driving voltage line and the metal layer are disposed on a same layer.

3. The display device of claim 1, further comprising:
an auxiliary driving voltage line electrically connected to the first region through a first contact hole; and
an upper storage electrode electrically connected to the second region through a second contact hole.

4. The display device of claim 3, wherein the driving voltage line includes an opening overlapping the first contact hole.

5. The display device of claim 3, wherein
the transistor includes a gate electrode disposed on the channel region, and
the display device further includes:
a first insulating layer disposed between the gate electrode and the channel region; and
a second insulating layer disposed between the gate electrode and the auxiliary driving voltage line.

6. The display device of claim 5, wherein the second insulating layer includes the first contact hole and the second contact hole.

7. The display device of claim 1, wherein
the transistor is a first transistor, and
the display device further includes a second transistor and a third transistor that are electrically connected to the first transistor.

8. The display device of claim 1, further comprising:
a buffer layer disposed between the metal layer and the semiconductor layer.

9. A display device comprising:
a conductive layer disposed on a substrate;
a transistor disposed on the conductive layer; and
a light emitting element electrically connected to the transistor, wherein
the transistor includes:
a semiconductor layer that overlaps a portion of the conductive layer; and
a gate electrode disposed on the semiconductor layer, the semiconductor layer includes a first region, a second region, and a channel region disposed between the first region and the second region, the conductive layer includes a driving voltage line and a metal layer that are spaced apart from each other, the driving voltage line overlaps the first region of the semiconductor layer, and the metal layer overlaps the second region of the semiconductor layer.

10. The display device of claim 9, further including:

an auxiliary driving voltage line electrically connected to the first region through a first contact hole; and an upper storage electrode electrically connected to the second region through a second contact hole.

11. The display device of claim 10, wherein the driving voltage line includes an opening overlapping the first contact hole.

12. The display device of claim 10, further comprising:

a buffer layer disposed between the conductive layer and the semiconductor layer.

13. The display device of claim 12, wherein the transistor includes a gate electrode disposed on the channel region, and the display device includes:

a first insulating layer disposed between the gate electrode and the channel region; and a second insulating layer disposed between the gate electrode and the auxiliary driving voltage line.

14. The display device of claim 13, wherein the second insulating layer includes the first contact hole and the second contact hole.

15. The display device of claim 13, further comprising:

a lower storage electrode electrically connected to the gate electrode, wherein the upper storage electrode and the lower storage electrode overlap each other.

16. The display device of claim 9, wherein the transistor is a first transistor, and the display device further includes a second transistor and a third transistor that are electrically connected to the first transistor.

17. The display device of claim 16, further comprising:

a data line electrically connected to the second transistor; and an initialization voltage line electrically connected to the third transistor.

18. The display device of claim 17, wherein the data line, the initialization voltage line, and the metal layer are disposed on a same layer.

* * * * *